United States Patent [19]

Talisa

[11] Patent Number: 4,926,116
[45] Date of Patent: May 15, 1990

[54] WIDE BAND LARGE DYNAMIC RANGE CURRENT SENSOR AND METHOD OF CURRENT DETECTION USING SAME

[75] Inventor: Salvador H. Talisa, Edgewood, Pa.

[73] Assignee: Westinghouse Electric Corp., Pittsburgh, Pa.

[21] Appl. No.: 264,578

[22] Filed: Oct. 31, 1988

[51] Int. Cl.$^5$ .................. G01R 19/00; G01R 33/02
[52] U.S. Cl. ......................... 324/117 R; 324/117 H; 324/251; 324/127; 333/248; 333/148
[58] Field of Search ............... 324/117 R, 117 H, 251, 324/252; 333/241, 244, 248, 147, 148

[56] References Cited

U.S. PATENT DOCUMENTS

| | | | |
|---|---|---|---|
| 3,983,477 | 9/1976 | Stuchly et al. | 324/117 R |
| 4,028,639 | 6/1977 | Hagon et al. | 333/148 |
| 4,400,669 | 8/1983 | Daniel et al. | 333/141 |
| 4,528,502 | 7/1985 | Rocha | 324/117 R |
| 4,559,495 | 12/1985 | Lienhard | 324/117 R |
| 4,605,911 | 8/1986 | Jin | 333/144 |
| 4,675,682 | 6/1987 | Adam et al. | 324/375 |
| 4,714,904 | 12/1987 | Willems | 333/148 |

OTHER PUBLICATIONS

"Dual Slope Magnetoresistive Current Sensor", IBM Technical Disclosure Bulletin, vol. 20, No. 2, Jul. 1977, pp. 865–866, by J. S. Feng.

Primary Examiner—Reinhard J. Eisenzopf
Assistant Examiner—Vinh P. Nguyen
Attorney, Agent, or Firm—G. S. Grunebach

[57] ABSTRACT

A wide band large dynamic range current sensor operable to measure current leakage in an external conductor utilizing a magnetostatic spin wave delay line (MSW) device is described. The measurable changes in well known electromagnetic properties of ferrite films, as utilized in MSW devices when these films are exposed to external current induced magnetic fields, results in a current sensitive detection device. A method of current detection using this device is also described. Specific, low power microelectronic applications as well as, high power, local and remote current detecting embodiments are included.

19 Claims, 4 Drawing Sheets

WIDE BAND LARGE DYNAMIC RANGE CURRENT SENSOR AND METHOD OF CURRENT DETECTION USING SAME

BACKGROUND OF THE INVENTION

1. Field of the Invention

The present invention relates to a wide band, large dynamic range magnetostatic delay line current sensor operable in the range from d.c. to several gigahertz having a high current sensitivity for a minimal detectable current in the order of 0.1 milliamps; specifically. High power, local, and remote current detection embodiments are also disclosed.

2. Description of the Prior Art

The invention described utilizes the high sensitivity of the magnetic spin wave phase with respect to changes in the biasing magnetic field producing a high sensitivity large bandwidth current sensor.

The magnetostatic wave delay lines based on ferrites having traveling wave propagation characteristics, for example, yttrium-iron garnet thin films (YIG) are microwave magnetic devices in which the electromagnetic energy couples through simple microstrip transducers into the magnetic properties of the material exciting a magnetic moment wave, or magnetostatic spin wave (MSW).

Important properties of a MSW delay line are the insertion loss, the wavenumber and the group delay and their evolution with frequency. These parameters are significant within the limited range of frequencies over which a MSW delay line operates. This frequency range or bandwidth is centered on a frequency, typically between 0.5 and 20 GHz, which depends on the strength of the applied magnetic bias field. The actual MSW delay line properties and bandwidth depend on design parameters such as ferrite film thickness, transducer width and distance from the ferrite to any ground planes above and below it.

The insertion loss is the loss of electromagnetic energy experienced between the input and the output of the device as a result of inefficient transducer operation and magnetic losses in the ferrite material. Typically, the insertion loss is lowest at the lower end of the frequency range of operation, increasing monotonically at higher frequencies. Typical minimum insertion losses are between 10 and 20 dB.

Magnetostatic waves have the property of being dispersive, that is, their propagation phase constant, or wavenumber, increases nonlinearly from zero to infinity over the frequency range over which MSWs can be launched. This dispersivity also depends on the design parameters described above.

The group delay is a measure of the time it takes for energy to travel between input and output transducers. It varies with frequency over the range of the device and its variation and absolute value depend also on the design parameters.

The problem to be solved then is the local and remote sensing in high electrical power systems as well as testing of an electronic printed circuit boards utilizing magnetostatic wave delay lines which are well known and can be commonly fabricated.

SUMMARY OF THE INVENTION

In accordance with the above requirements, the present invention a wide band large dynamic range current sensor utilizing magnetostatic wave principles in magnetostatic wave delay lines based on ferrite, for example, yttrium iron garnet (YIG) thin films has been described wherein it may be utilized for high electrical power system current line sensing and the testing of electronic circuit printed boards.

Specifically, the present invention current detector comprises a magnetostatic delay line. This magnetostatic delay line is operable to receive a signal of predetermined frequency. Further, the delay line comprises at least one ferrite traveling wave propagating film having a known phase propagation coefficient.

The magnetostatic delay line is positioned within a first magnetic field, also known as a biasing field. The magnetostatic delay line is then subjected to a second magnetic field. This second magnetic field is generated by and is proportional to a current in a conductor external to the magnetostatic delay line. The increase or decrease in the known phase propagation coefficient in response to this second magnetic field within the ferrite traveling wave propagating film is detectable.

A method of current detection employing the described and claimed current sensor is also developed. Specific applications of the current sensor to high power, local and remote current detection as well as, low power microelectronic application are described.

BRIEF DESCRIPTION OF THE DRAWING

For a better understanding of the invention reference may be had to the preferred embodiment exemplary of the invention shown in the accompanied drawings in which.

DESCRIPTION OF THE PREFERRED EMBODIMENTS

A slab of alumina substrate, double bonded with a metal on both the top and bottom surfaces of the substrate, serves as the basis of the magnetostatic spin wave delay line or filter.

This slab of alumina material having; an etched top surface forming dual microstrip transducers, and electrical contacts which serve as the input contact for the input transducer, and the output contact for the output transducer is operable to receive an input signal generated by an oscillating frequency generator. Generator operates for example in the 0.5–20 gigahertz range and is grounded. The output contact comprising, for example gold (Au) ribbon connects the output transducer to a voltage detector, here for example, a diode which is also grounded. To complete the MSW delay line means, a slab of yttrium iron garnet (YIG) backed by a layer of gadollinium gallium garnet (GGG), having a predetermined length, width and depth is placed across the input transducer and the output transducer. The input and output transducers extend the full width beneath the YIG slab, between the YIG slab and the alumina substrate.

During MSW delay line operation, the grounded, frequency generating oscillator inputs a signal $f_o$ which enters the MSW delay line means through the input. Input is connected to the input transducer and drives this signal $f_o$ beneath the YIG slab.

YIG has a predisposition to orient its magnetic particles when exposed to a signal of predetermined frequency $f_o$. This orientation also results in an oscillation of these magnetic particles in the YlG slab. This oscillation results in a time delay for the signal $f_o$ between the time when it is received by the input transducer and the time when it exits the MSW delay line means through output transducer. YIG is a member of the family of ferrites, or ferromagnetic insulators, having this property of traveling wave propagation. This traveling wave generated within the YIG slab moves between input transducer and output transducer with a known phase propagation coefficient K.

The functioning MSW delay line or filter incorporates a yoke of for example, soft iron surrounding the magnetostatic delay line. A magnetic field, also known as a bias field is generated around the delay line by at least one magnet. One or two permanent magnets may be used alone or in combination with an electromagnet. The intensity of the magnetic bias field will be determined by the number and strength of the permanent or electromagnets. The specific dimensions of the YIG film, the strength of the bias field and the frequency of the signal $f_o$; all are parameters in the propagation of a wave through the YIG substrate.

Figure 1:
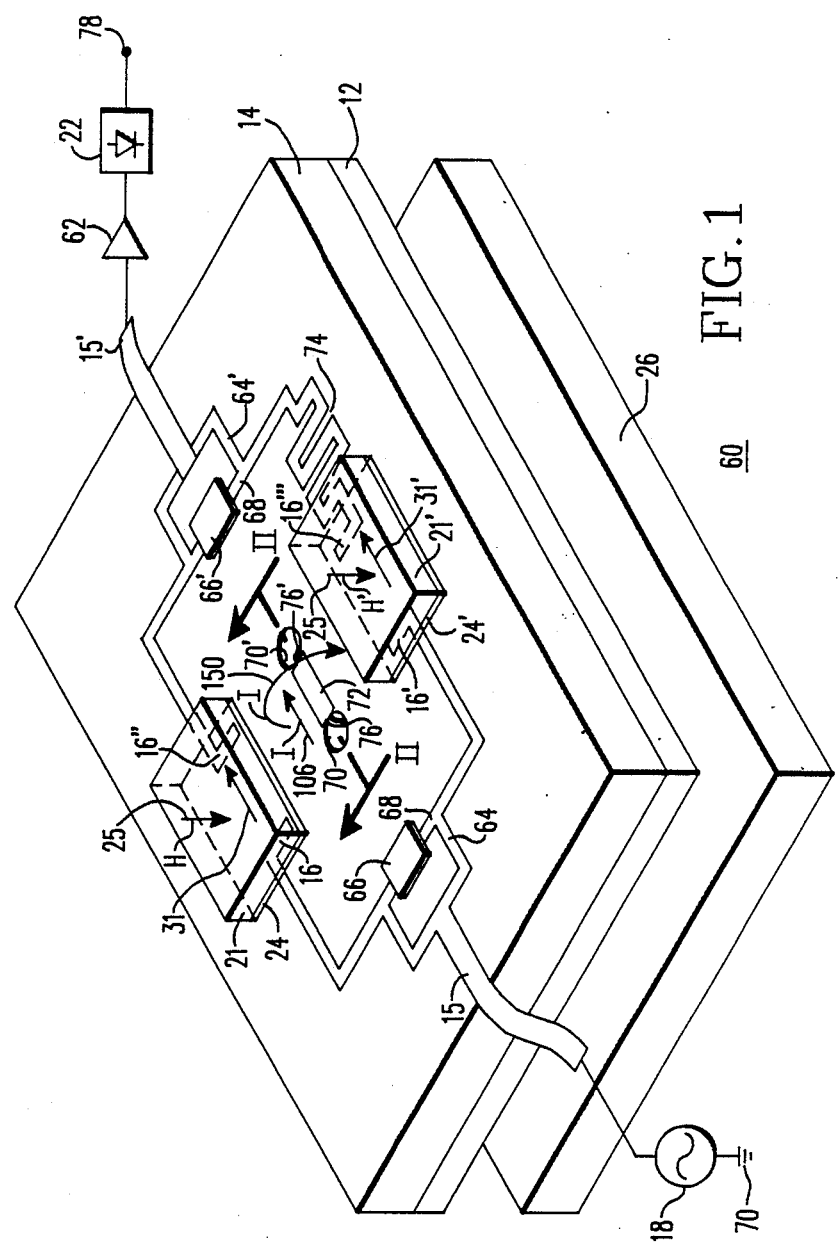
FIG. 1 is an isometric top view of the preferred embodiment, a magnetostatic spin wave current detector having cross-section IVD—IVD.

FIG. 1 is an isometric top view of one example of the preferred embodiment, a magnetostatic spin wave current detector 60 having cross section II—II. This embodiment of the MSW current detector 60 incorporates two MSW delay lines comprising twin, parallel ferrite films 24, 24'. A grounded 20, frequency generator 18 produces an input signal $f_o$ which enters the MSW detector 60 via input contact 15. This signal $f_o$ is split by a voltage divider 64 which is etched from, for example, gold (Au) upon the surface of the substrate 14. This voltage divider 64 may be, for example, a Wilkinson voltage divider which divides the signal, $f_o$ with a minimal signal loss. A resistor 66, more clearly described in FIGS. 1A and 1B, interconnected in parallel with the voltage divider 64 prevents feedback reflection of the signal $f_o$ from one of its inputs into the other output. The split signal $f_o$ enters microstrip transducers 16, 16', which are sandwiched between the two ferrite films for example YIG films, 24, 24' topped with GGG substrates 21, 21'. In this MSW current detector 60, YIG films provide the ferrite traveling wave propagation means. The signals pass through the YIG films 24, 24' as traveling waves 31, 31' respectively. The output transducers 16", 16''' receive the waves 31, 31' dependent upon: the predetermined bias field H, 25 applied to the MSW detector 60 from at least one magnetic source 26, the dimensions of the YIG films 24, 24' and the known coefficient of propagation K of the films 24, 24'. Two holes 70, 70' are cut through the substrate 14 and ground (Au gold) 12 at a point between the parallel ferrite films 24, 24'. A conductive microstrip 72 etched from, for example, gold (Au) upon the surface of the substrate 14 rests between the two holes 70, 70'. A thin conductive ribbon 76 76' of again gold (Au) as an example, interconnects the conductive microstrip 72 to ground 12 and to a conductive current loop 90, more clearly shown in FIG. 4D. if a current 106 is generated in the conductive microstrip 72, a magnetic field 150 will be generated surrounding the current 106. This magnetic field 106 will, because of the proximity of the current 106 to the two ferrite films 24, 24' result in a change in the bias magnetic field H, 25 operating on both films 24, 24'. As shown configured in FIG. 1 for this MSW delay line current detector 60, if the orientation of the magnetic field 150 is as indicated by the arrow the magnetic biasing field 25 operating on film 24 will increase while the magnetic biasing field 25 operating on film 24' will decrease. Proportionally, the known phase propagation coefficient K of the films will decrease for YIG film 24, and increase for YIG film 24'. The signals exiting the films 24, 24' through output contacts 16", 16''' will evidence this change of the known biasing field 25. The two signals exiting the YIG films 24, 24' will be combined by a signal combiner 64', which is not unlike the signal divider 64 utilized previously. The signal exiting output contact 16''' enters a phase shifting device 74 formed of gold (Au) microstrips configured on the surface of the alumina substrate 14. This phase shifting device 74 shifts the phase of the received output signal from film 24' 180° or 90° from the original phase of the input signal. When the signal exiting film 24 is combined with the signal exiting film 24', the difference in the known biasing field H, 25 as affected by the induced magnetic field 150 generated by gold microstrip conductor 72 is transmitted through contact 15' into amplifier 62, where this difference in signals is amplified. A detector 22, such as for example, a diode will detect the field change as a proportional current value. This current value is read at output port 78. The frequency of the signal $f_o$ generated by the oscillating generator is in, for this example of the preferred embodiment, the range of 0.5 through approximately 20 gigahertz for this MSW delay line current detector 60. The device 60, when a current to be measured induces a change of phase shift $\Delta \phi$ through each delay line, can be represented by:

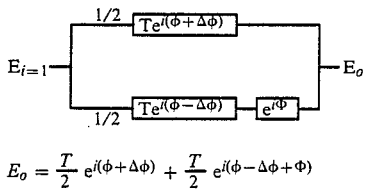

$$E_o = \frac{T}{2} e^{i(\phi + \Delta\phi)} + \frac{T}{2} e^{i(\phi - \Delta\phi + \Phi)}$$

where:
$E_i$ is the input signal amplitude normalized to 1;
$E_o$ is the output signal amplitude;
$T$, is the insertion loss in each delay line ($T<1$)
$\phi$, is the phase shift in each delay line in the above absence of a current to be measured;
$\Delta\phi$, is the change in phase shift due to current to be measured;
$\Phi$, is the fixed phase shift introduced (for example a meander line).

The voltage measured at the output detector is proportional to $|E_o|^2$ which, in turn, is proportional to the voltage $V_M$:

$$V_M = \tfrac{1}{2} |e^{i\Delta\phi} + e^{i(\Phi - \Delta\phi)}|^2 = 1 + \cos(2\Delta\phi - \Phi)$$

where:
Two possibilities exist for the phase shift $\Phi$:
(a) $\Phi = -180°$ Then $$V_m = 1 - \cos(2\Delta\phi)$$

For small currents, for example, small $\Delta\phi$, the voltage detected is very small. However, this mathematical concept applies to large signals as well.
(b) $\Phi = -90°$ $$V_m = 1 + \sin(2\Delta\phi)$$

Higher sensitivity for small signals because the rate of change of voltage with phase shift is higher.

Figure 1A:
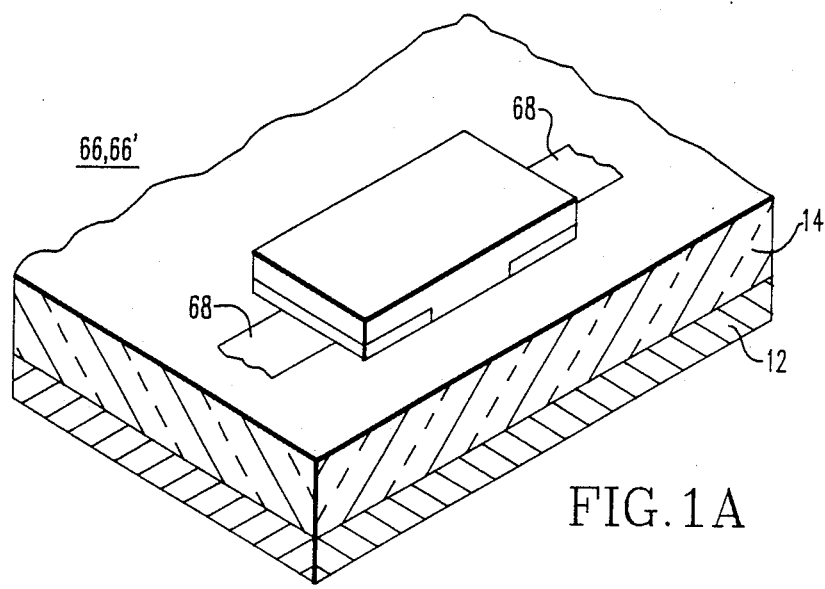
FIG. 1A is an isometric view of the ceramic resistor used in the fabrication of the preferred embodiment, clearly shown in FIG. 1.

FIG. 1A is an isometric view of a ceramic resistor 66, 66' as used in the fabrication of the preferred embodiment shown in FIG. 1. This resistor 66, 66' mounted upon alumina substrate 14, may be used at the input from the Wilkinson power divider and output of a Wilkinson power combiner, and is operable to present direct signal reflection of $f_o$ back towards the oscillator 18. This ceramic resistor 66, 66' has input contacts 68, which for this example, comprises gold (Au) microstrip etched upon the surface of alumina substrate 14.

Figure 1B:
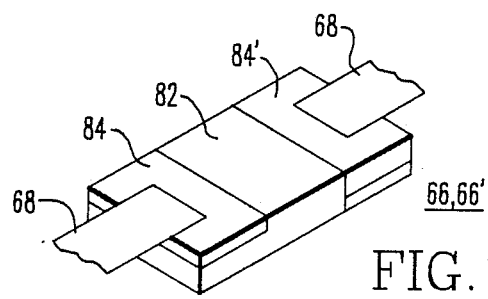
FIG 1B is a bottom plan view of the ceramic resistor used in the fabrication of the preferred embodiment, as shown in FIG. 1A.

FIG. 1B is a bottom plan view of the ceramic resistor 66, 66' as shown in FIG. 1. The connectors 68, rest upon two conductive surfaces 84, 84' upon the underside of the ceramic resistor 66, 66'. A thin resistive film structure 82 is electrically interconnected to conductive surfaces 84, 84'.

Figure 2:
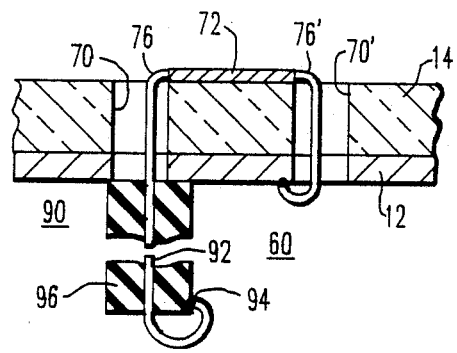
FIG. 2 is cross-section IVD—IVD of the preferred embodiment, a magnetostatic spin wave current detector as shown in FIG. 1B.
Figure 2A:
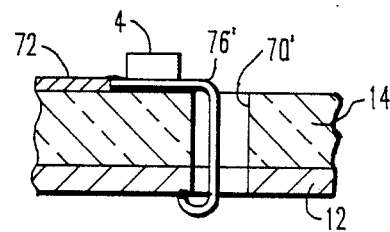
FIG. 2A is a cross-section IVD—IVD of an alternative embodiment employing a resistor for impedance matching.

FIG. 2 is a cross-sectional view taken along line II—II of the preferred embodiment, a magnetostatic spin wave current detector 60 as shown in FIG. 1. This cross-sectional view II—II is taken across the two holes 70, 70' cut through the substrate 14 and ground plane 12. A conductive strip 72 extends between the two holes 70, 70' upon the substrate 14. A thin conductor, i.e. gold (Au) ribbon 76' connects one end of conductor 72 to ground 12 through hole 70'. FIG. 2A is an alternative embodiment shown in cross-section of IVD—IVD wherein resistor 4 is placed in thin conductor 76' to ground. This resistor 4 serves to match the impedance of the line, enabling the sensor to operate at high frequencies. A coaxial cable sheathed current loop means 90, is mechanically interconnected beneath the opposing hole 70 and electrically interconnected to conductor 72 by thin conductor 76. The coaxial cable sheathed looped conductor means 90 is comprised of a thin wire conductor 92 surrounded by a coaxial sheath 96. The wire conductor 92 extends outside the sheath 96 in a loop, grounded at an interconnection 94. The loop configuration as shown for this embodiment 60 in FIG. 2 should not be considered in the limiting sense. The loop of conductor 92 may be physically deformed in a variety of ways as required by the current detection needs of the specific application.

Figure 3:
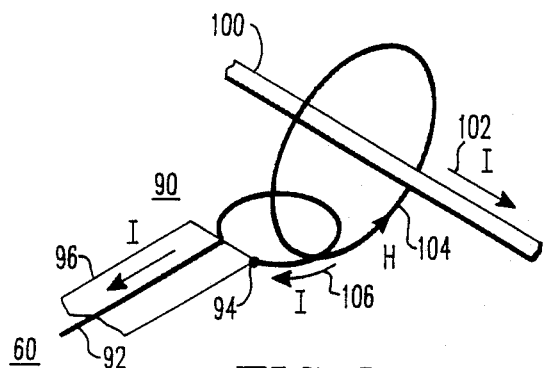
FIG. 3 is a plan view of an alternative embodiment, a high power local application of the magnetostatic spin wave current detector.

FIG. 3 is a plan view of the coaxial cable sheathed looped conductor means 90 configured in a high power, local detection application. A current conductor 100 having current I, 102 generates a magnetic field H, 104. This magnetic field 104 induces a current 106 in the looped thin conductor 92. This looped conductor grounded at point 94 on the coaxial sheath 96, directs the induced current 106 into the MSW delay line current detector 60 more clearly shown in FIG. 1. For a local, high power application, the loop in the thin conductor 92 would have a diameter of approximately a few inches.

Figure 4:
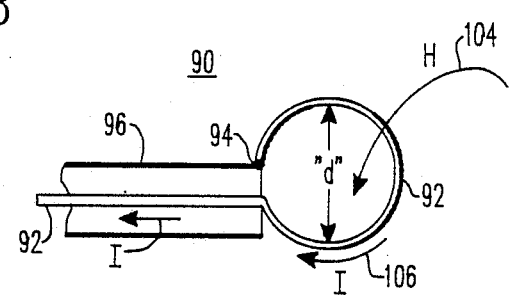
FIG. 4 is a side view of an alternative embodiment of a high power remote application of the magnetostatic spin wave current detector.

FIG. 4 is a cross-sectional view of an alternative embodiment, a high power, remote current detecting application. The thin looped conductor 92 now having a greater diameter of approximately, a foot is still grounded to sheath 96. The magnetic field 104, from a remote conductor, not shown, generates current 106 in looped conductor 92. This current 106 again moves within the coaxial sheath 96 along conductor 92 to MSW delay line current detector 60.

Figure 5:
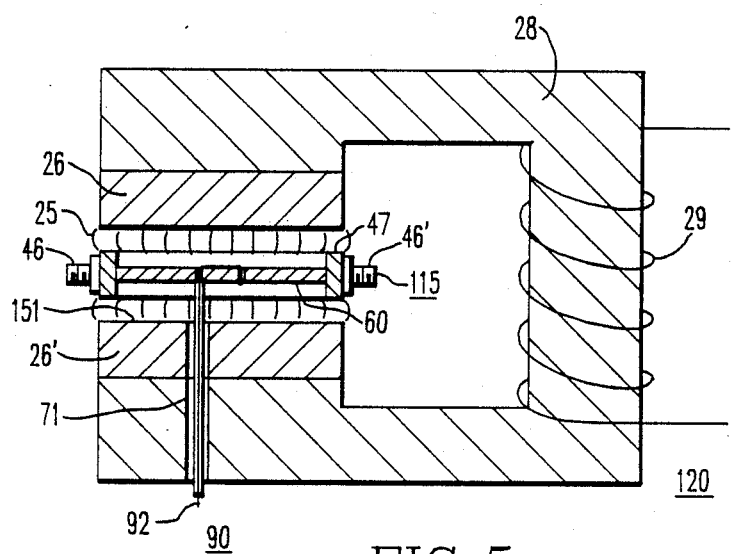
FIG. 5 is a cross-section view of the preferred embodiment, a magnetostatic spin wave current detector having the detecting coaxial cable exiting an orifice within the yoke.

FIG. 5 is a cross-sectional view of one example of the preferred embodiment, a MSW current detector 120 having an iron yoke 28, with gap 151. The magnetostatic delay line current detector 60 is mounted within the gap 151. The magnetic bias field 25 may be generated by permanent magnets 26, 26' or an electromagnet 29. All three magnetic sources 26, 26' and 29 may be used in combination to achieve a magnetic field 25 of predetermined known bias. An orifice 71 cut through the permanent magnet 26' and yoke 28 allows coaxial cable sheathed loop conductor 90 to exit the yoke 28. A containment means 115 protects the MSW delay current detector 60. ESM connectors 46, 46' input and output respectively the signal $f_o$ which is propagated through the MSW delay line current detector 60.

Figure 6:
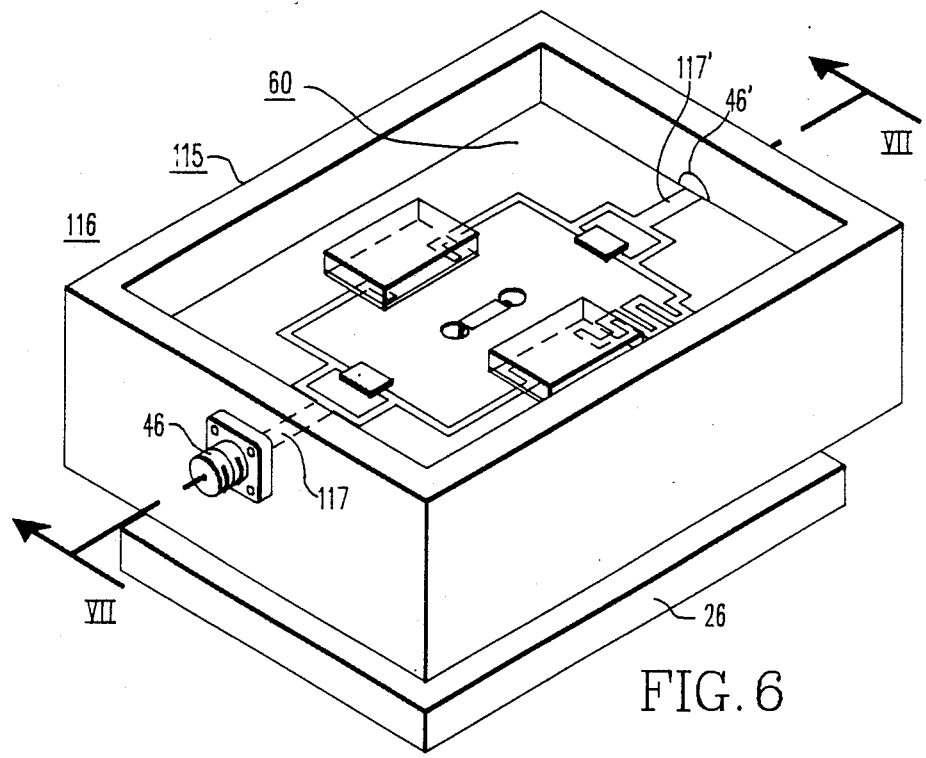
FIG. 6 is an isometric view of the preferred embodiment, a magnetostatic spin wave current detector within a containment means.

FIG. 6 is an isometric view of the magnetostatic spin wave current detector 60 within a containment means 115 as shown in FIG. 5. Cross section VII—VII of this embodiment 115 is taken across the midpoint of the MSW current detector 60. SMA connectors 46, 46' contact the microstrip on the substrate 14 through pin contacts 117, 117' and input and output, respectively signal $f_o$.

Figure 7:
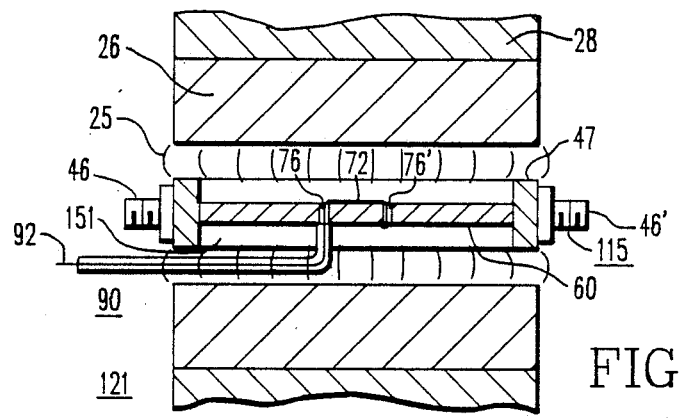
FIG. 7 is a cross-section view of the preferred embodiment, a magnetostatic spin wave current detector having the detecting coaxial cable exiting the underside of the containment means.

FIG. 7 is cross-sectional view taken along line VII—VII, of a preferred embodiment 115 as shown in FIG. 6. In this embodiment of a MSW delay line current detector 121 has the coaxial cable looped conductor 90 with loop conductor 92 exiting the metal yoke 28 in gap 151 between the permanent magnets 26, 26'. A known biasing magnetic field 25 exists between permanent magnets 26, 26'. SMA connectors 46, 46' interconnecting pin connectors 117, 117' input and output the signal across the MSW delay line current detector 60.

Figure 8:
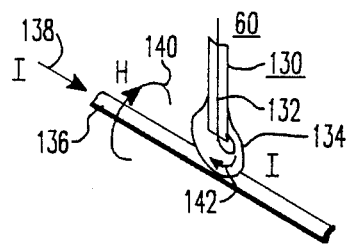
FIG. 8 is a plan view of an alternative preferred embodiment, a magnetostatic spin wave current detector having a lower power electronics and wide band application.

FIG. 8 is a plan view of the loop conductor portion of yet another alternative embodiment, a magnetostatic spin wave current detector 60 having a coaxial cable looped detector means 130 of an extremely small size. This detector means 130, operable with the MSW current detector 60 would be useful in the current detection of low power, electronics applications having wide band, fast transients. A looped conductor 132 within the coaxial cable looped conductor 130 is approximately 0.008 inches in length. The diameter of the conductor loop for this application would be approximately 0.002 inches. A current 138, in circuit microstrip 136, generates a magnetic field 140. This magnetic field 140 induces a current 142 within the looped conductor 132. The looped conductor, due to its small size is in this embodiment dipped in an epoxy encasing 134, which provides insulation and wear protection for the looped conductor 132.

In summary, the wide band, large dynamic range current sensor is described by this application having a high sensitivity to the degree of a tenth of a milliamp (0.1 mA), a large dynamic range to the level of six orders of magnitude or more, using suitable attenuators having a wide band range of several gigahertz. A flexibility of design applications for different sensing requirements based ultimately upon the power requirements is another advantage of this device.

Numerous variations may be made in the above described combination and different embodiments of this invention may be made without departing from the spirit thereof. Therefore it is intended that all matter contained in the foregoing description and in the accompanying drawings shall be interpreted as illustrative and not in a limiting sense.

What is claimed is:

1. A current detector, comprising:
   a magnetostatic delay line, said delay line operable to receive a signal of a predetermined frequency, said delay line further comprising at least one ferrite wave propagating means, said ferrite wave propagating means having a known phase propagation coefficient;
   a means for producing a first magnetic field, said means for producing a first magnetic field being cooperatively associated with said magnetostatic delay line, said magnetostatic delay line being positioned within said first magnetic field;
   a means for producing a second magnetic field, said means for producing a second magnetic field being cooperatively associated with said magnetostatic delay line, said magnetostatic delay line being subjected to said second magnetic field, said second magnetic field being proportional to the current in an external conductor, said known phase propagation coefficient increasing or decreasing in response to said second magnetic field; and
   a means for detecting, said detecting means operable to detect said increase or said decrease in said known phase propagation coefficient.

2. A current detector as in claim 1, wherein said magnetostatic delay line further comprises a first and a second ferrite wave propagating means, said first and said second wave propagating means positioned parallel one to the other.

3. A current detector as in claim 1, wherein said means for producing a first magnetic field further comprises at least one permanent magnet.

4. A current detector as in claim 1, wherein said means for producing a first magnetic field further comprises at least one electromagnet.

5. A current detector as in claim 1, wherein said means for producing a second magnetic field further comprises a loop conductor.

6. A current detector as in claim 1, wherein said ferrite wave propagating means further comprises a yttrium ion garnet (YIG) thin film.

7. A method of detecting current, which comprises:
   providing a magnetostatic delay line, said delay line operable to receive a signal of a predetermined frequency, said delay line further comprising at least one ferrite wave propagating means, said ferrite wave propagating means having a known phase propagation coefficient;
   providing a means for producing a first magnetic field, said means for producing a first magnetic field being cooperatively associated with said magnetostatic delay line, said magnetostatic delay line being positioned within said first magnetic field;
   providing a means for producing a second magnetic field, said means for producing a second magnetic field being cooperatively associated with said magnetostatic delay line, said magnetostatic delay line being subjected to said second magnetic field, said second magnetic field being proportional to the current in an external conductor, said known phase propagation coefficient increasing or decreasing in response to said second magnetic field; and
   providing a means for detecting, said detecting means operable to detect said increase or said decrease in said known phase propagation coefficient.

8. A current detector, comprising:
   a magnetostatic delay line, said delay line operable to receive a signal of a predetermined frequency, said delay line further comprising a first and a second ferrite wave propagating means, said first and said second ferrite wave propagating means being so positioned parallel one to the other, said first and said second ferrite wave propagating means having a known phase propagation coefficient;
   a means for producing a first magnetic field, said magnetostatic delay line being positioned within said first magnetic field;
   a means for producing a second magnetic field, said means for producing a second magnetic field being so positioned between said first and said second ferrite wave propagating means, said first and said second ferrite wave propagating means being subjected to said second magnetic field, said second magnetic field being proportional to the current in an external conductor, said known phase propagation coefficient of said first and second second ferrite wave propagating means increasing or decreasing in response to said second magnetic field; and
   a means for detecting said detecting means operable to detect said increase or said decrease in said known phase propagation coefficient.

9. A current detector as in claim 8, wherein said first and said second ferrite wave propagating means further comprises yttrium iron garnet (YIG) film.

10. A current detector as in claim 8, wherein said means for producing a first magnetic field further comprises at least one permanent magnet.

11. A current detector as in claim 8, wherein said means for producing a second magnetic field further comprises a loop conductor.

12. A current detector as in claim 8, wherein said means for producing a first magnetic field further comprises at least one electromagnet.

13. A current detector, comprising:
a magnetostatic delay line, said magnetostatic delay line having an input port, said input port operable to receive a signal of a predetermined frequency, said delay line comprising a voltage divider, said voltage divider operable to divide said signal received by said input port, said delay line further comprising a first and a second ferrite wave propagating means positioned parallel one to another, said first and said second ferrite wave propagating means having phase propagation coefficients and said first and said second ferrite wave propagating means operable to receive said divided signal, said delay line comprising a voltage combiner, said voltage combiner operable to receive said divided signals from said first and said second ferrite wave propagating means, and further operable to combine said divided signals and said delay line having an output port, said output port operable to receive said combined signals and output said combined signals;
a means for producing a first magnetic field, said magnetostatic delay line being positioned within said first magnetic field;
a means for producing a second magnetic field, said means for producing a second magnetic field being positioned between said parallel first and said second ferrite wave propagating means, said first and said second ferrite wave propagating means being subjected to said second magnetic field, said second magnetic field being proportional to the current in an external conductor, said known phase propagation coefficient of said first and said second ferrite wave propagating means increasing or decreasing in response to said second magnetic field; and
a means for detecting, said detecting means operable to detect said increase or said decrease in said known phase propagation coefficient of said first and said second ferrite wave propagating means.

14. A current detector, comprising:
a magnetostatic delay line, said delay line operable to receive a signal of a predetermined frequency, said delay line further comprising at least one ferrite wave propagating means having a known phase propagation coefficient;
a magnetostatic delay line support means, said support means operable to contain and support said magnetostatic delay line within a gap in said support means;
at least one magnetic field producing means, said magnetic field producing means being positioned within said gap in said magnetostatic delay line support means, said magnetic field producing means being cooperatively associated with said magnetostatic delay line, said magnetic field producing means being proximate said magnetostatic delay line, said magnetic field producing means operable to produce a first magnetic field having a known strength;
a means for producing a second magnetic field, said means for producing said second magnetic field being cooperatively associated with said magnetostatic delay line, said magnetostatic delay line being subjected to said second magnetic field, said second magnetic field being proportional to the current in an external conductor, said known phase propagation coefficient increasing or decreasing in response to said second magnetic field.

15. A current detector as in claim 14, wherein said magnetostatic delay line support means further comprises a metal yoke; said metal yoke having a first and a second end, said magnetostatic delay placed between said first and said second end.

16. A current detector as in claim 14, wherein said means for producing a second magnetic field further comprises a loop conductor.

17. A current detector as in claim 14, wherein said magnetic field producing means further comprises a permanent magnet.

18. A current detector as in claim 14, wherein said magnetic field producing means further comprises an electromagnet.

19. A method of detecting current, which comprises:
providing a magnetostatic delay line support means, said support means operable to contain and support a magnetostatic delay line within a gap in said support means;
providing at least one magnetic field producing means, said magnetic field producing means being positioned within said gap in said magnetostatic delay line support means, said means for producing said first magnetic field being cooperatively associated with said magnetostatic delay line, said magnetic field producing means being proximate said magnetostatic delay line, said magnetic field producing means operable to produce a first magnetic field having a known strength; and
providing a means for producing a second magnetic field, said magnetostatic delay line being subject to said second magnetic field, said means for producing said second magnetic field being cooperatively associated with said magnetostatic delay line, said second magnetic field being proportional to the current in an external conductor, said known phase propagation coefficient increasing or decreasing in response to said second magnetic field.

* * * * *